United States Patent [19]
Moranski et al.

[11] Patent Number: 6,094,289
[45] Date of Patent: Jul. 25, 2000

[54] METHOD AND APPARATUS FOR OPTICAL CODE READING USING A MEM OPTICAL RESONATOR HAVING AN INTEGRAL PHOTODETECTOR

[75] Inventors: Jeffrey A. Moranski, New Berlin, Wis.; Manouchehr Edward Motamedi, Newbury Park, Calif.; Daniel J. Jinar, Burlington, Wis.; Dawn S. Garcia-Nuñez, Pomona, Calif.; Angus P. Andrews, Westlake Village, Calif.; Sangtae Park, Northridge, Calif.

[73] Assignee: Rockwell Technologies, LLC, Thousand Oaks, Calif.

[21] Appl. No.: 09/287,186

[22] Filed: Apr. 6, 1999

Related U.S. Application Data

[63] Continuation-in-part of application No. 08/847,018, May 1, 1997, Pat. No. 5,903,380.

[51] Int. Cl.⁷ .................................................. G02B 26/08
[52] U.S. Cl. ........................... 359/223; 359/224; 235/462
[58] Field of Search .................................. 359/196–199, 359/202, 209, 212–214, 223, 224; 235/462, 472, 470; 250/234

[56] References Cited

U.S. PATENT DOCUMENTS

| | | |
|---|---|---|
| 3,758,199 | 9/1973 | Thaxter . |
| 3,902,783 | 9/1975 | Bodlaj . |
| 4,385,798 | 5/1983 | Yevick . |
| 4,436,364 | 3/1984 | Lauer et al. . |
| 5,015,831 | 5/1991 | Eastman et al. ........................ 235/462 |
| 5,170,277 | 12/1992 | Bard et al. .............................. 359/210 |
| 5,198,651 | 3/1993 | Barkan et al. .......................... 235/472 |
| 5,295,014 | 3/1994 | Toda ....................................... 359/202 |
| 5,329,103 | 7/1994 | Rando ..................................... 235/462 |
| 5,596,446 | 1/1997 | Plesko ..................................... 359/214 |
| 5,614,706 | 3/1997 | Bard et al. .............................. 235/472 |
| 5,629,510 | 5/1997 | Quinn et al. ........................... 235/462 |
| 5,691,834 | 11/1997 | Plesko ..................................... 359/202 |

OTHER PUBLICATIONS

Article: "Nippon Signal Brings Blue–Laser Advance to Light" (Electronic Engineering Times Nov. 1998).
Article: "Miniaturized Systems with Micro–Optics and Micromechanics III" by M. Edward Motamedi and Rolf Gooring (Jan. 1998) SPIE The International Society for Optical Engineering, vol. 3276, pp. 66–80.
Article: "Development of Micro–Electro–Mechanical Optical Scanner" by Motamedi et al. (May 1997) Opt. Eng. 36(5) pp. 1346–1353.
Article: "MEM's The Word For Optical Beam Manipulation" by K.Y. Lau (Circuits & Devices, Jul. 1997) pp. 11–18.

*Primary Examiner*—James Phan
*Attorney, Agent, or Firm*—Jay G. Durst; John J. Horn; A. M. Gerasimow

[57] ABSTRACT

An optical code reader comprises an integrated optical resonator that is disposed within a housing and that includes a substrate, a cantilever beam, and a bimorph actuator. The cantilever beam is affixed at one end to the substrate, and at least a portion of the cantilever beam has a reflective transmit surface on one side and a photodetector on an opposite side. The bimorph actuator is affixed to the cantilever beam and is responsive to an electrical stimulus to cause the cantilever beam to move in accordance with the stimulus. Movement of the cantilever beam causes the reflective surface to cooperate with a light beam generated by a light source to provide a spot of light that moves on a code pattern, and also causes a field of view of the photodetector to be dynamically altered such that the photodetector tracks movement of the moving spot of light. Additionally, the code reader also comprises a reflective collection surface having a conical shape, and the photodetector is located approximately at a focal point of the reflective collection surface. The combination of these features permits a high signal-to-noise ratio to be achieved, so that the code reader exhibits superior operating characteristics as defined by long read range and large depths of field. The disclosed optical code reader is structurally reliable, low cost and small size, has improved scalability, has minimal power requirements, and uses only a minimal number of discrete components.

17 Claims, 12 Drawing Sheets

METHOD AND APPARATUS FOR OPTICAL CODE READING USING A MEM OPTICAL RESONATOR HAVING AN INTEGRAL PHOTODETECTOR

CROSS REFERENCE TO RELATED APPLICATION

This application is a continuation-in-part of U.S. Ser. No. 08/847,018, filed May 1, 1997 ("Micro-Electromechanical (MEM) Optical Resonator and Method", U.S. Pat. No. 5,903,380, to Motamedi et al.), allowed.

BACKGROUND OF THE INVENTION

1. Field of the Invention

This invention relates to a method and apparatus for optical code reading and, in particular, relates to a method and apparatus for code reading that utilizes a micro-electromechanical (MEM) optical resonator having an integral photodetector.

2. Description of the Related Art

Optical code reading systems have found widespread acceptance in a variety of diverse applications such as information handling, consumer checkout, and factory/warehouse automation. In a typical application, a product, package or other physical entity is marked with a code, such as a typical one dimensional bar code comprising a pattern of black bars or lines. A code reader is then used to read the bar code pattern and to thereby identify the physical entity.

There are two general types of architectures employed in code readers: imager based and laser scanning based. Imager based code readers capture an image of the code pattern using a CCD or similar integrated circuit that employs a matrix of pixels. The code pattern is then decoded using image processing techniques. The advantages of this approach include solid state reliability, orientation insensitivity, and code type flexibility. Another advantage of this approach is that the imaging device is usable in conjunction with code patterns formed of low contrast symbols. However, this advantage is of limited benefit in practice since the vast majority of code reading applications use standard bar codes which are formed of high contrast symbols. The disadvantages of this approach include limited depth of field and read range, the need for a separate high energy light source, and limited resolution.

Laser scanning based code readers scan the code pattern with a moving laser spot. The code pattern may then be determined by determining the instantaneous amount of light reflected as a function of time during a given scan interval (or, in practice, during multiple scan intervals for redundancy). The advantages of this approach include high speed, high resolution, integral light source, longer range and larger depth of field. The advantages of the laser scanning approach and the disadvantages of the imaging approach have led to the laser scanning approach being the preferred approach for most warehouse/factory automation applications as well as many other applications.

Nevertheless, existing laser scanning based code readers suffer several disadvantages related to the optical resonator used to provide the moving laser spot. Generally, an optical resonator comprises an oscillating mirror that is used to reflect/scan a light beam from a laser light source onto a target. Currently, optical resonators include rotating motors with polygon mirror facets, oscillating stepper or galvonmetric motors moving a mirror, rotating motors driving a holographic disc, and resonant flexure devices driving a mirror or light source.

The devices that are currently used to construct optical resonators suffer from the following disadvantages. First, existing optical resonators employ structure that is susceptible to mechanical fatigue and failure. Optical resonators constructed using rotating devices have bearings that are susceptible to failure. Optical resonators constructed using resonant flexure devices having bending or rotational spring elements are also susceptible to failure. Generally, any metallic element that experiences a large number of stress cycles (as will be the case in a scanning engine) is susceptible to failure due to imperfections in the metal structure, i.e., grain boundaries at which cracks may initiate and propagate. In short, therefore, existing optical resonators are not as reliable as solid state devices which, lacking structural fatigue mechanisms, have extremely high reliability.

Second, existing optical resonators comprise several to many discrete components, consume significant space and are relatively costly. As previously described, existing optical resonators include rotating motors with polygon mirror facets, oscillating stepper or galvonmetric motors moving a mirror, rotating motors driving a holographic disc, and resonant flexure devices driving a mirror or light source. As the number of discrete components increases, so too does the space consumed by the components and the cost of providing and assembling the components.

SUMMARY OF THE INVENTION

An optical code reader apparatus and method are provided that overcome these drawbacks of the prior art. In particular, in accordance with one aspect of the invention, an optical code reader comprises an integrated optical resonator that is disposed within a housing and that includes a substrate, a cantilever beam, and a bimorph actuator. The cantilever beam is affixed at one end to the substrate, and at least a portion of the cantilever beam has a reflective surface on one side and a photodetector on an opposite side. The bimorph actuator is affixed to the cantilever beam and is responsive to an electrical stimulus to cause the cantilever beam to move in accordance with the stimulus. In accordance with a preferred embodiment of the invention, the bimorph actuator is a thermal bimorph actuator comprising a plurality of stacked material layers at least two of which have unequal thermal expansion coefficients.

In a particularly preferred embodiment, the movement of the cantilever beam causes the reflective surface to cooperate with a light beam generated by a light source to provide a spot of light that moves on a code pattern. The movement of the cantilever beam then also causes a field of view of the photodetector to be dynamically altered such that the photodetector tracks movement of the spot of light.

In another particularly preferred embodiment, the reflective surface is a reflective transmit surface and the code reader also comprises a reflective collection surface. The reflective collection surface has a conical shape, and the photodetector is located approximately at a focal point of the reflective collection surface.

Significantly, the placement of the photodetector on the same cantilever beam as the reflective surface permits a tracking system to be implemented. Additionally, the location of the photodetector at the focal point of a conical collection surface maximizes optical gain. The combination of these features permits a high signal-to-noise ratio to be achieved, so that the code reader exhibits superior operating characteristics as defined by long read range and large depths of field.

In accordance with another aspect of the invention, a method of optically reading a code pattern disposed comprises producing a moving spot of light on the code pattern, tracking the moving spot of light with a photodetector, including dynamically altering a field of view of the photodetector in accordance with the movement of the moving spot of light, and detecting the light beam reflected from the code pattern with the photodetector. The step of producing the moving spot of light includes the steps of generating a light beam using a light source, stimulating a bimorph actuator, and reflecting the light beam from a reflective surface disposed on the cantilever beam.

The code reader apparatus and method disclosed herein enjoy numerous advantages over existing code readers and methods. First, the code reader is structurally reliable. The code reader utilizes an optical resonator which is formed of a single crystal of silicon in microscale and which therefore has material properties that far exceed the bulk properties of both non-single crystalline materials and materials in ordinary scale. Within the range of amplitudes of oscillation, the reliability of the structure is on the order of solid state device reliability.

Second, the code reader is low cost and small in size. Due to CMOS compatibility and batch processing, the optical resonator described herein is among the most compact and inexpensive scanning systems known to be able to achieve oscillation frequencies in the hundred of scans per second while also offering a scan angle over 20 degrees. Having circuitry for signal processing and driving the bimorph actuator integrated on the same substrate as the optical resonator allows calibration to be done to create a uniform population of scanners. Circuitry integrated with the optical resonator does not need to be implemented discretely on printed circuit boards, thus lowering the overall system cost and size significantly.

Additional advantages include the code reader being readily scalable, the code reader requiring minimal power, and the code reader being constructed using a minimal number of discrete components. Notably, all of these advantages are achievable while also achieving the usual advantages that existing laser scanning based code readers already enjoy over imager based systems, namely, high speed, high resolution, integral light source, longer range and larger depth of field.

Further features and advantages of the invention will be apparent to those skilled in the art from the following detailed description, taken together with the accompanying drawings.

BRIEF DESCRIPTION OF THE DRAWINGS

Preferred exemplary embodiments of the invention are illustrated in the accompanying drawings in which like reference numerals represent like parts throughout, and in which.

DETAILED DESCRIPTION OF THE INVENTION

Figure 1:
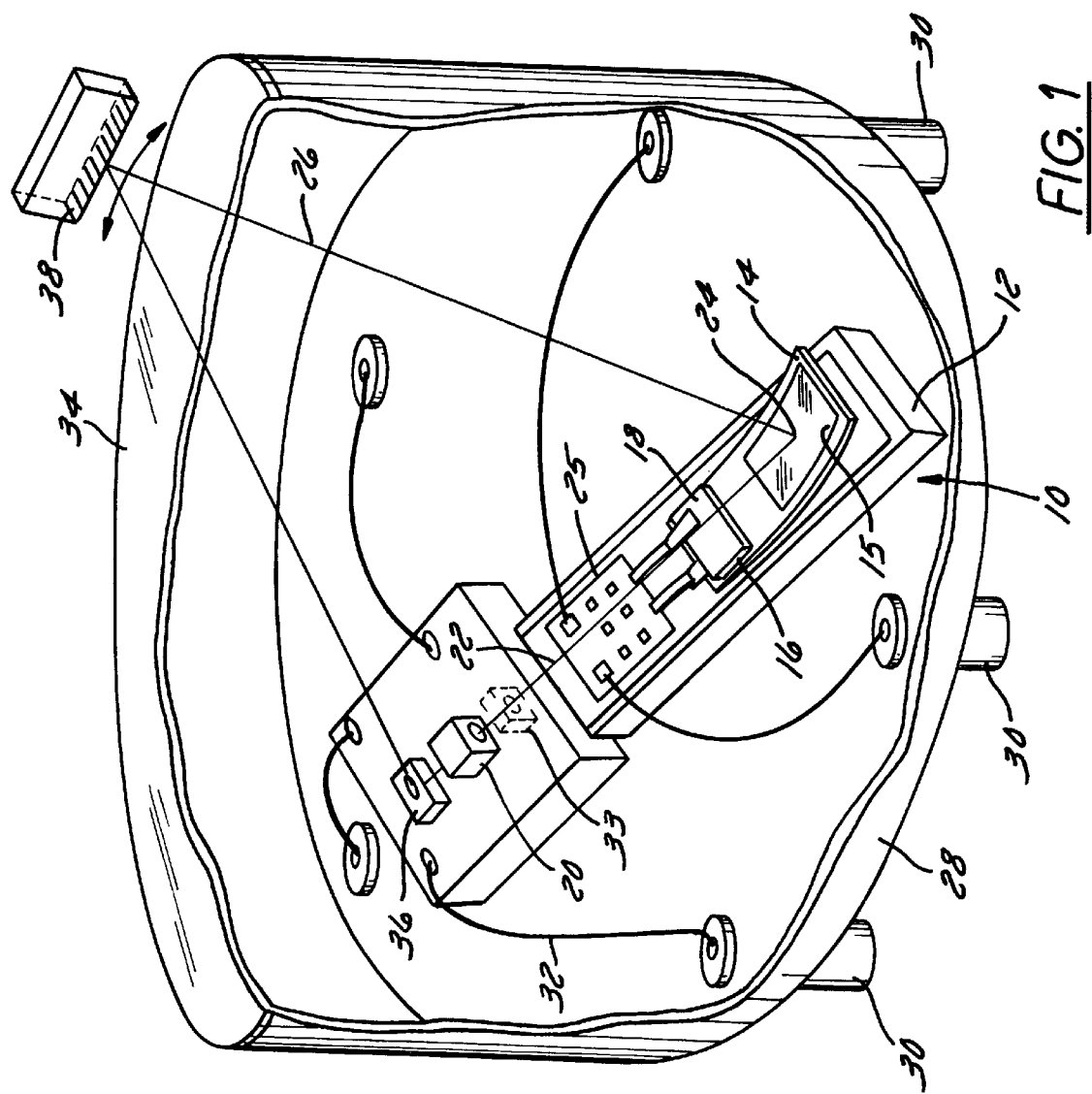
FIG. 1 is a perspective view of a first preferred embodiment of an optical code reader according to the present invention.

1. First Preferred Embodiment of Code Reader System and Method a. Structure and Operation Referring now to FIG. 1, a first preferred embodiment of an optical code reader 10 in accordance with the present invention is shown. The code reader 10 comprises an optical resonator 11 including a substrate 12, cantilever beam 14 with reflective surface 15, thermal bimorph actuator 16 including actuator electrodes 18. The cantilever beam 14 of the optical resonator 11 oscillates when the bimorph actuator 16 is driven with an AC stimulus. The structure and operation of the optical resonator 11 are described in greater detail below in conjunction FIGS. 2–10.

The optical resonator 11 and a light source 20 are arranged such that the output 22 generated by the light source impinges on the reflective surface 15 of the cantilever beam. The source's output 22 is preferably directed to strike near the midpoint 24 of the reflective surface 15 when the surface is at its center position, to increase the scan angle over which the light 22 is reflected. The mechanical and optical scan angles of the code reader 10 are determined by the distance the reflective surface 15 moves when oscillating. (In general, in code reading systems, mechanical scan angle is defined as the angle between the plane of the oscillating mirror or other reflective surface at one oscillation extreme and the plane of the mirror at the other oscillation extreme. Optical scan angle is defined as the angle between a light beam reflected off the mirror at one oscillation extreme and a light beam reflected off the mirror at the other extreme, which is equal to twice the mechanical scan angle. As used below, "scan angle" refers to the optical scan angle.)

Actuator excitation circuitry 25 for driving actuator 16 is integrated with the resonator 11 on substrate 12. The resonator 11, light source 20 and circuitry 25 form an optical scanner engine, generating a scanning light beam 26 when activated.

The scanner engine's components are preferably contained within a housing 28 (shown with the wall cut-away to reveal the engine components), which preferably includes means for conveying external signals to the engine components, via connector pins 30 and wire bonds 32, for example. External signals necessary for the scanner engine's operation may include one or more power supply voltages, for example. Actuator excitation circuitry 25 may alternatively be placed on a separate die from the resonator 11 (though still within the housing 28), or even be external to the housing and connected to the actuator via the connection pins.

Because the resonator's reflective surface functions regardless of the wavelength of incoming light, the invention operates with any type of light source. Light source 20 is preferably a circular collimated laser diode, to reduce ellipticity found in many common laser diodes. Alternatively, collimating and focusing optics 33 may be placed between the source 20 and the reflective surface 15. Another alternative (discussed below) is the fabrication of a single-surface collimator in the area of the reflective surface 15, which provides a well-collimated output beam using a simple laser diode as light source 20.

The housing preferably includes an optical window 34, through which the scanning light beam 26 exits. All of the components described above can fit within a common housing (such as TO-8), providing a convenient, rugged, reliable optical scanner engine.

The code reader 10 also includes a photodetector 36 which receives light from scanning light beam 26 which reflects off of a target 38, such as a bar code, and back through optical window 34. The photodetector 36 produces an output which varies in accordance with the light received, which is sent to additional circuitry (not shown) for processing.

Figure 2:
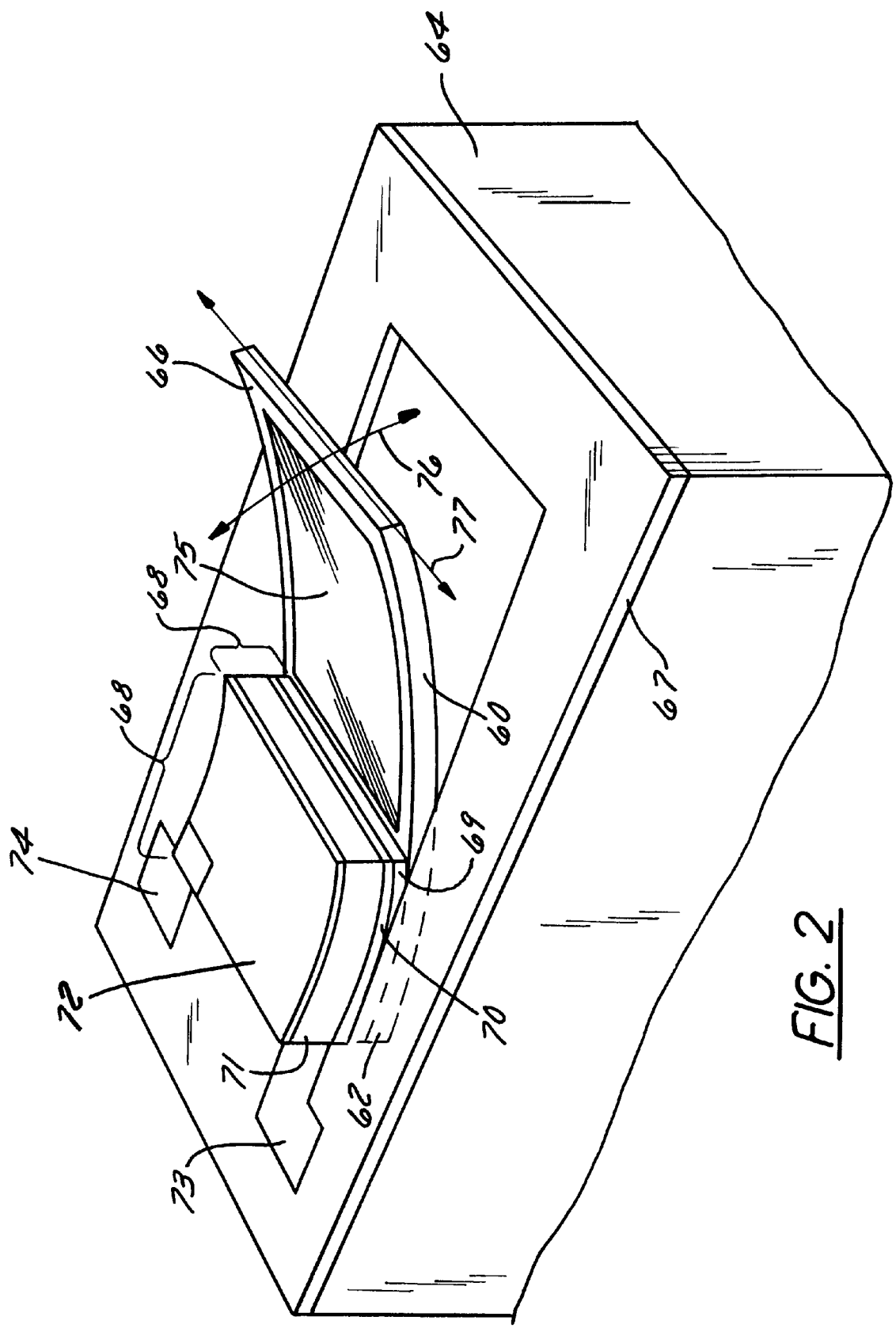
FIG. 2 is a perspective view of an optical resonator that may be used in the optical code reader illustrated in FIG. 1.

Referring now to FIGS. 2–10, additional description of various alternative preferred embodiments of the optical resonator 11, as well as the fabrication thereof, will now be provided. Referring first to FIG. 2, one preferred embodiment of an optical resonator is shown. A cantilever beam 60 is affixed at one end 62 to a substrate 64, and extends freely over the substrate at a second end 66. An insulating layer 67, preferably silicon dioxide ($SiO_2$), is on the substrate 64, and a thermal bimorph actuator 68 is atop the insulating layer 67 at the beam's fixed end 62.

Bimorph actuators in general are made from at least two stacked layers of material, with each layer having unique structural or electrical properties. The different properties result in a stress distribution through the actuator that is discontinuous with depth. Modulating the stress level in the actuator changes both 1) the longitudinal tension or compression, and 2) the bending moment in the beam cross section. This causes one end of the actuator to 1) move longitudinally (with respect to an opposite end) to relieve the longitudinal stress, and, 2) move in the depth direction (with respect to an opposite end) to relieve the bending stresses. The motion due to bending is the principal actuator action utilized by the present invention.

The bimorph actuator 68 used in the present invention is a thermal bimorph actuator. A thermal bimorph actuator is a bimorph actuator that comprises material layers having different thermal expansion coefficients. Forcing the actuator's temperature to rise and fall causes the layers to expand and contract accordingly, creating a "thermal bimorph effect". The actuator 68 is positioned over the beam's fixed end 62, and the beam is made to bend via the thermal bimorph effect.

The bimorph actuator 68 includes all of the material layers which are stacked atop each other at the fixed end of the beam 60, including the beam itself 60, a portion 69 of insulating layer 67, a metal layer 70 on the $SiO_2$, a bimorph material layer 71, and a second metal layer 72 atop the bimorph material. All the layers contribute to the thermal bimorph effect described above, but the biggest contributors are metal layer 72 and bimorph layer 71. (Metal layer 70, positioned near the neutral plane of the actuator structure, contributes very little to the bimorph effect.) The thermal expansion coefficient of metal is higher than that for most bimorph materials, so placing the quicker-expanding metal layer 72 atop the bimorph layer 71 causes the beam to be forced to bend downward when the actuator is heated.

The beam 60 occupies a static "rest position" when actuator 68 is not subjected to any forced heating. The temperature of actuator 68 is made to rise and fall by causing an electrical current to flow through its layers; increasing the current heats the actuator and causes the beam 60 to bend down and away from its rest position, and reducing the current allows the actuator to cool and return towards its rest position. Metal layers 70 and 72 serve as bottom and top electrodes, respectively, through which current is made to flow through the bimorph material 71. Connection pads 73 and 74 connected to electrodes 70 and 72, respectively, are preferably provided on insulating layer 67, to facilitate the application of a current flow inducing voltage across electrodes 70 and 72. When an AC voltage is applied across the electrodes, actuator 68 heats and cools at the frequency of the AC voltage, causing the cantilever beam's free end 66 to move up and down at the same frequency. The voltage applied across electrodes 70 and 72 is referred to herein as the "actuator excitation voltage".

A reflective surface 75 covers a portion of the cantilever beam 60 at its free end 66. The movement of the reflective surface in accordance with the excitation of actuator 68 creates an optical resonator.

The substrate 64 and cantilever beam 60 are preferably made from single crystal silicon, which provides a higher yield, easier handling and higher reliability than other substrate materials which could be used, such as gallium arsenide. The use of silicon also enables the integration of actuator excitation circuitry, including CMOS or bipolar components, for example, on the same substrate with the resonator.

The bimorph material 71 serving as part of bimorph actuator 68 is required to heat up in response to a current flowing through it. Zinc oxide (ZnO) or polysilicon are preferred bimorph materials, though other materials having a resistivity on the order of $10^3$–$10^4$ ohm-cm are acceptable. The electrodes 70 and 72 are preferably gold with a thin titanium film as an adhesion layer, which provides excellent electrical conductivity and contributes to the thermal bimorph effect of the bimorph actuator 68.

The reflective surface 75 may be simply the silicon surface of the cantilever beam, which provides a reflectivity of about 30%. However, the reflective surface is preferably a mirror, achieved by depositing preferably a layer of gold in the reflective surface area, which increases reflectivity to about 90% and can be deposited simultaneously with the top electrode 72. (Fabrication of the optical resonator is discussed in detail below). A layer of aluminum also provides excellent reflectivity, but would require an additional masking step not needed with gold.

The actuator heats and cools as the current flowing between electrodes 70 and 72 increases and decreases, respectively. The preferred actuator excitation voltage, therefore, is an AC voltage which is DC biased to prevent it from passing through zero. In practice, a DC bias of about 1 volt is applied across the actuator (top electrode 72 positive with respect to the bottom electrode 70), heating the actuator and causing the beam to bend downward and occupy a "center position", and an AC voltage of about 2 $V_{p-p}$ causes the beam to oscillate approximately equally about the center position.

The amount by which the cantilever beam's free end 66 moves, i.e., its "excursion" distance, is affected by the magnitude and frequency of the actuator excitation voltage. As a mechanical structure, the resonator has several resonant frequencies (dependent on factors such as beam thickness and length, number and thickness of the actuator layers, and the properties of the cantilever and actuator materials), including a fundamental resonant frequency $f_0$. For a given actuator excitation voltage, the beam's excursion distance is greatest when the excitation frequency is equal to $f_0$. The scan angle of the reflective surface 75 is directly related to excursion distance, and is also greatest at $f_0$.

An actual resonator built per the present invention provided a scan angle (with a light source directed at the reflective surface 75) of about 25 degrees when excited with a sinusoidal AC voltage of about 2 $V_{p-p}$ biased with about 1 Vdc, and having a frequency about equal to the resonator's fundamental resonant frequency $f_0$ of about 140 Hz.

When the resonator is excited at its fundamental resonant frequency $f_0$, it causes the beam to move up and down with respect to the substrate, with the resultant scan angle referred to as the "vertical" scan angle 76. As a mechanical structure, however, the resonator has a number of additional resonance modes. It has been observed that at least one of these additional resonant frequencies, $f_{lat}$, induces the beam to oscillate in a direction orthogonal to the fundamental mode, creating a "lateral" scan angle 77. This characteristic is exploited to create a two-dimensional (2-D) resonator. Two AC voltages, one oscillating at $f_0$ and one at $f_{lat}$, are time-multiplexed onto the connection pads 73 and 74 to produce resonator movement in two dimensions. When a light source is directed onto the resonator's reflective surface 75 (as discussed below), a 2-D scanning beam is produced. One optical resonator produced a vertical scan angle of about 16 degrees when excited at its $f_0$ frequency of about 210 Hz, and a lateral scan angle of about 15 degrees when excited at its $f_{lat}$ frequency of about 700 Hz. Typically, however, lateral scan angle has been demonstrated to be about ¼ that of the vertical scan angle. The resonant frequencies of a given cantilever beam are preferably determined empirically, by slowly sweeping the frequency of the actuator excitation voltage and observing the resulting scan angles.

An alternative technique for exciting a 2-D resonator uses a frequency modulated actuator excitation voltage, with the lower resonant frequency $f_0$ modulating a carrier signal which is at the higher resonant frequency $f_{lat}$.

The cantilever beam depicted in FIG. 2 is intended as merely illustrative. For example, reflective surface 75 is preferably flatter than shown (achievable per the fabrication method described below), and the arrangement of electrodes around the bimorph actuator(s) can differ from that shown.

Figure 3A:
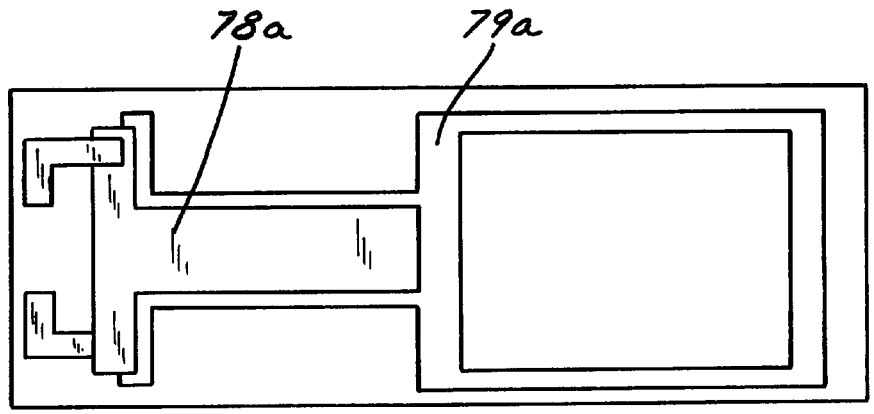
FIGS. 3A, 3B and 3C are plan views of three bimorph actuator/cantilever beam/reflective surface configurations for an optical resonator that may be used in the optical code reader illustrated in FIG. 1.
Figure 3B:
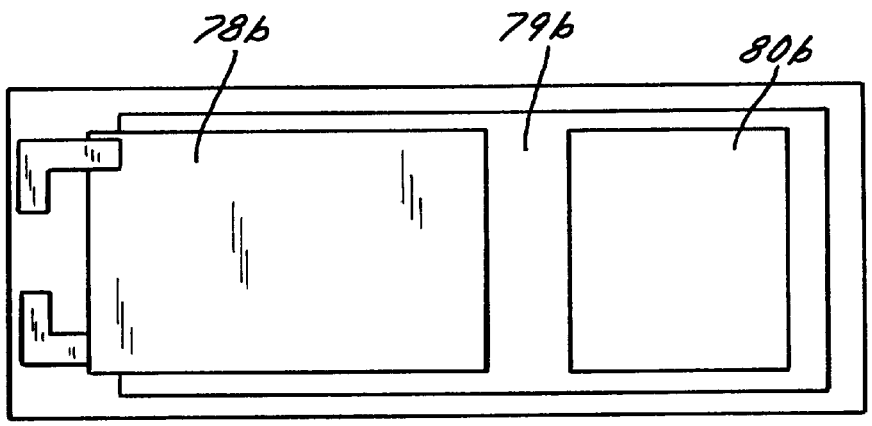
Figure 3C:
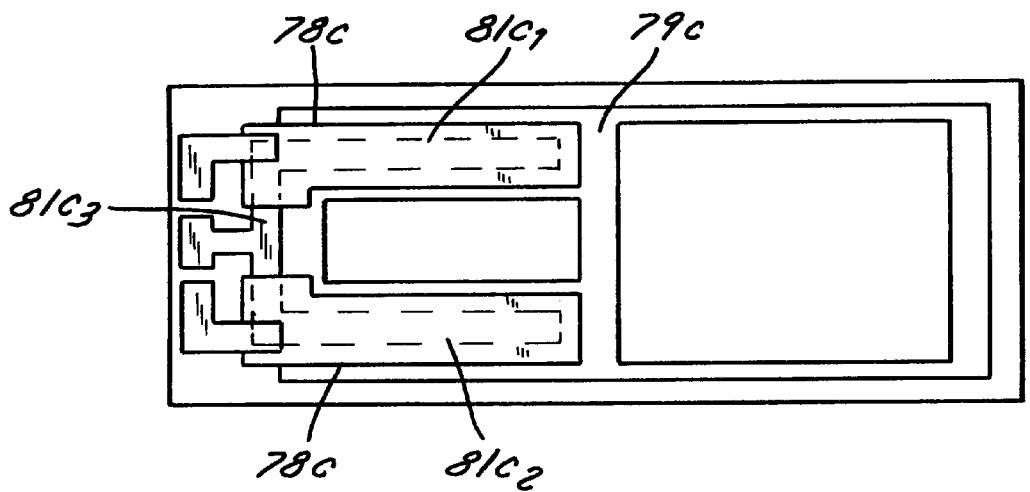

The shape of the bimorph actuator's footprint on the cantilever beam 60, and the shape of the beam itself, affects the performance of the resonator. Plan views of three alternative actuator/beam shapes are shown in FIGS. 3A–3C. In FIG. 3A, an actuator 78a with a narrow width is used, which gives the beam 79a to which it is attached, which is also narrowed in the area beneath the actuator, more freedom to oscillate in a lateral or torsional mode, as is necessary for 2-D scanning. In FIG. 3B, a larger actuator 78b is combined with a smaller reflective surface 80b to increase the obtainable vertical scan angle. In FIG. 3C, a U-shaped actuator 78c is split into two fingers which are positioned along respective edges of the cantilever beam 79c, which features a hollowed-out area between the fingers. Three electrodes are used, with electrodes $81c_1$ and $81c_2$ on top of respective fingers, and one electrode $81c_3$ providing a common ground beneath the fingers. Because the fingers hold the beam 79c by its edges, warping in the beam due to residual stress is reduced. A common actuation voltage is preferably applied across $81c_1/81c_3$ and $81c_2/81c_3$.

Figure 4:
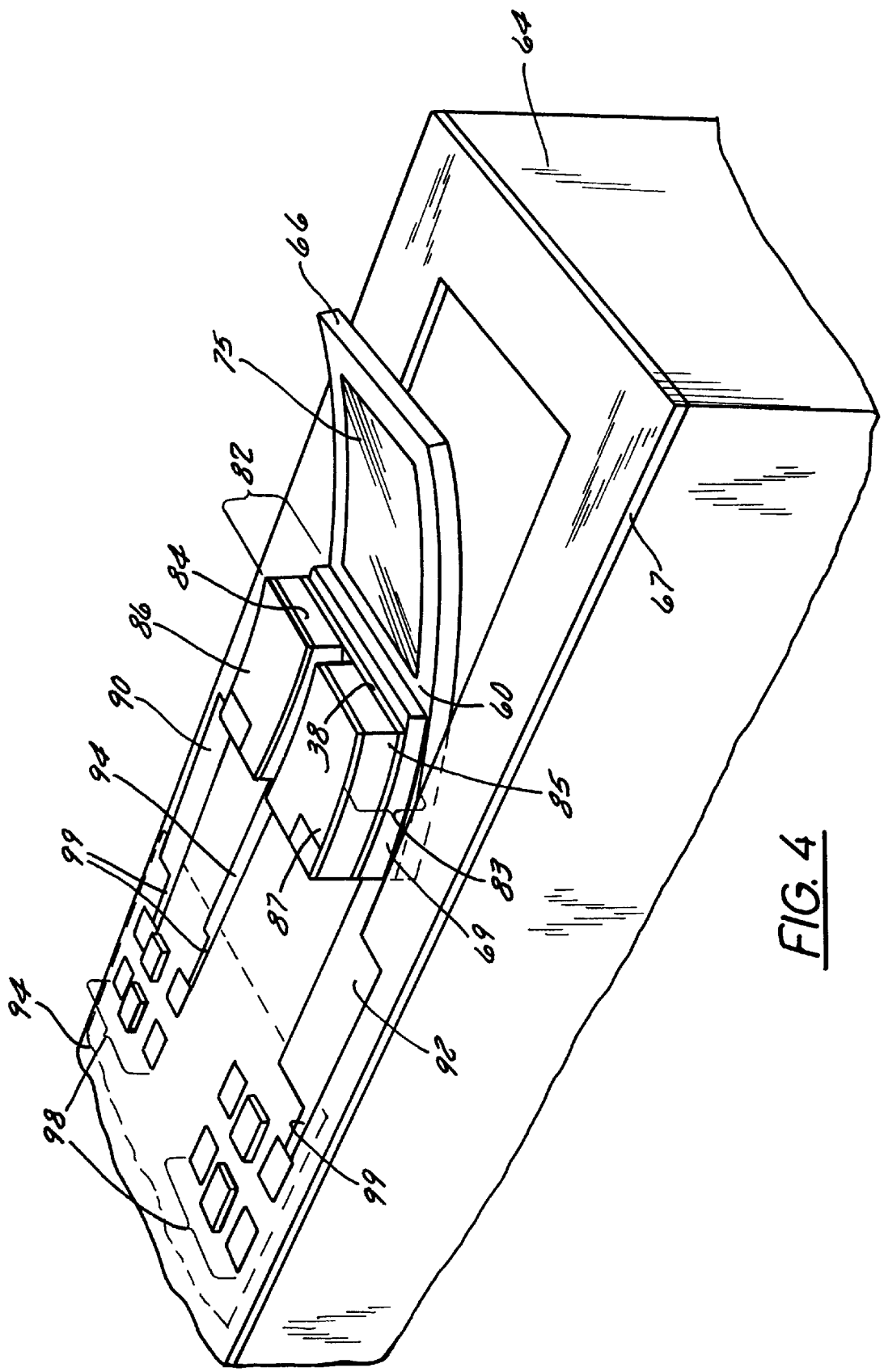
FIG. 4 is a perspective view of a two-actuator embodiment of an optical resonator that may be used in the optical code reader illustrated in FIG. 1, further showing the integration of actuator excitation circuitry on the same substrate as the resonator.

An alternate two-actuator embodiment of an optical resonator per the present invention is shown in FIG. 4. Two independent bimorph actuators 82 and 83 are positioned side by side atop the portion 69 of insulting layer 67 over the fixed end of cantilever beam 60. The actuators include respective bimorph material layers 84 and 85 sandwiched between respective electrodes 86 and 87 on the top, and a common ground electrode 88 on the bottom, with the three electrodes electrically isolated from each other. Connection pads 90, 92, and 94 extend from the actuators and make electrical contact with electrodes 86, 87 and 88, respectively. When both actuators 82 and 83 are excited with the same AC voltage, the resonator performs similarly to the one-actuator configuration of FIG. 2. However, when the two driving voltages—particularly the respective DC bias voltages—are unequal, a twist is induced into beam 60, which can be used to enhance the optical flatness of the reflective surface 75, or to enhance the optical performance of a lensed reflective surface (discussed below). The resonant frequencies of each beam/actuator structure will be nearly equal, and both actuators are preferably driven with a single frequency; inequalities due to small differences in resonant frequency are preferably compensated for by adjusting the DC biases of the respective actuator excitation voltages.

The three-terminal/two-actuator resonator implementation shown in FIG. 4 has been used to provide 2-D scanning, but the lateral scan angle obtainable with this twisting technique has been unacceptably low, typically less than 5 degrees. The two-frequency time or frequency multiplexed actuator excitation voltage scheme discussed above is preferred for 2-D operation.

A major advantage is presented by the invention by virtue of its preferred implementation on a silicon substrate. This allows other circuitry, such as the actuator excitation circuitry needed to drive the bimorph actuator(s), to be integrated on the same substrate, as is illustrated in FIG. 4. Actuator excitation circuitry 96, comprising a number of integrated active devices 98 for example, is interconnected with the optical resonator via metallization traces 99 running between the circuitry 96 and the connection pads 90, 92 and 94 of actuators 82 and 83. The active devices shown are intended as merely illustrative; metallization traces which would typically interconnect the active devices are not shown.

Other advantages are inherently present in the integrated optical resonator, including very small size, very low-cost, and light weight. High reliability is expected due to the very low mass of the components, and has been empirically established by cycling the beam of one resonator in excess of 5 billion times without failure or any noticeable degradation of performance.

b. Fabrication

Figure 5A:
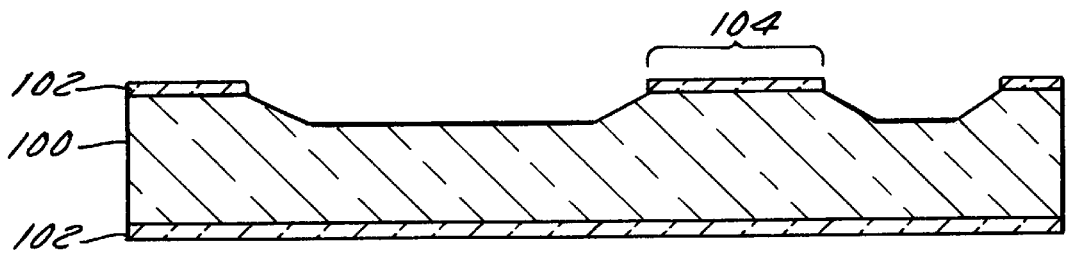
FIGS. 5A–5G are sectional views illustrating a process sequence for fabricating an optical resonator that may be used in the optical code reader illustrated in FIG. 1.
Figure 5B:
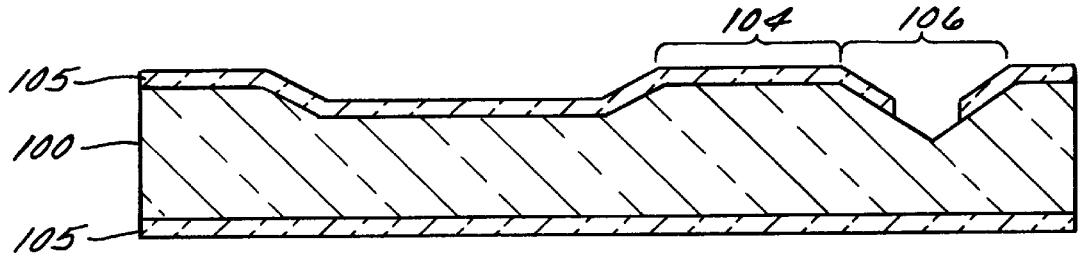
Figure 5C:
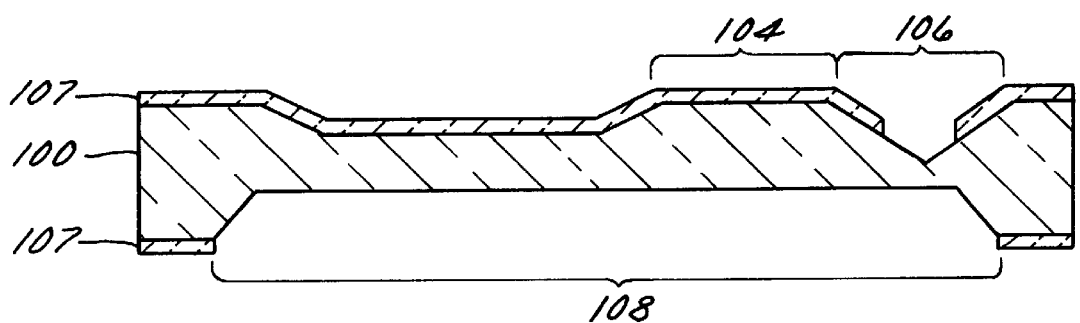

An optical resonator as described herein may be fabricated using a double-sided bulk micromachining process with six mask levels. Sectional views of one possible process sequence are shown in FIGS. 5A–5G. A substrate 100 is covered on top and bottom with a grown layer of $SiO_2$ 102. The first mask level defines a mesa area 104, the top of which will become the reflective surface of the resonator; etching is done using a 25% tetra-methyl-ammonium-hydroxide (TMAH) solution, resulting in the structure shown in FIG. 5A. Oxide layer 102 is stripped and a new oxide layer 105 is grown. The second mask level features a cut-through pattern which, when etched, creates a channel 106 which establishes the length, width and thickness of the cantilever beam; etching is accomplished with the TMAH solution and results in the structure shown in FIG. 5B. A corner protection scheme is used to preserve the integrity of the mesa 104 and beam (ref. no. 116 in FIG. 5G) structures. One such scheme locates extra tabs of silicon on critical corners; then, rather than damaging the corners during subsequent etching steps, the tabs are etched away in the course of processing the device. Oxide layer 105 is stripped and a new oxide layer 107 is grown. The third mask level defines the backside area 108, which is etched with TMAH until the desired scanner beam thickness is nearly, but not completely, obtained. As shown in FIG. 5C, a small amount of silicon should be left between the bottom of the cut-through channel 106 and the backside 108, to be etched later. TMAH etching is described in detail in O. Tabata, R. Asahi, H. Funabaski, K. Shimaoka, and S. Sugiyama, "Anisotropic etching of silicon in TMAH solutions," *Sensors and Actuators,* A34 (1992), pp. 51–57. Front-to-backside alignment is done using a 1× contact aligner with an infrared-red/visible light source. The alignment marks for backside alignment are patterned on the front side with a regular lift-off process using aluminum. After the backside oxide is patterned, the aluminum is stripped off using an HCl solution.

Figure 5D:
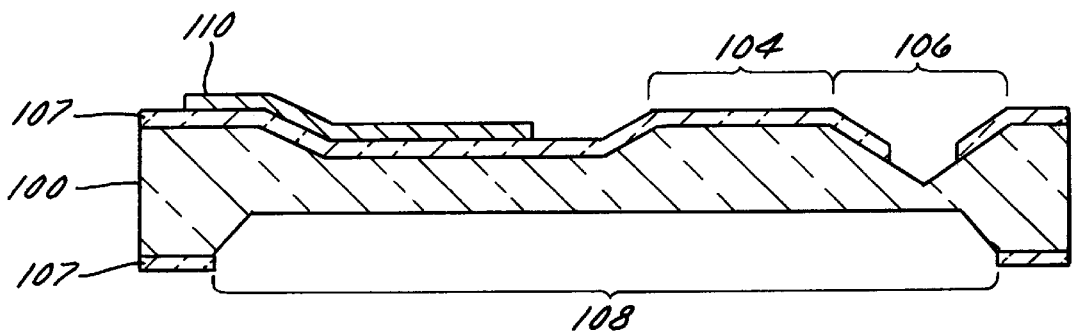
Figure 5E:
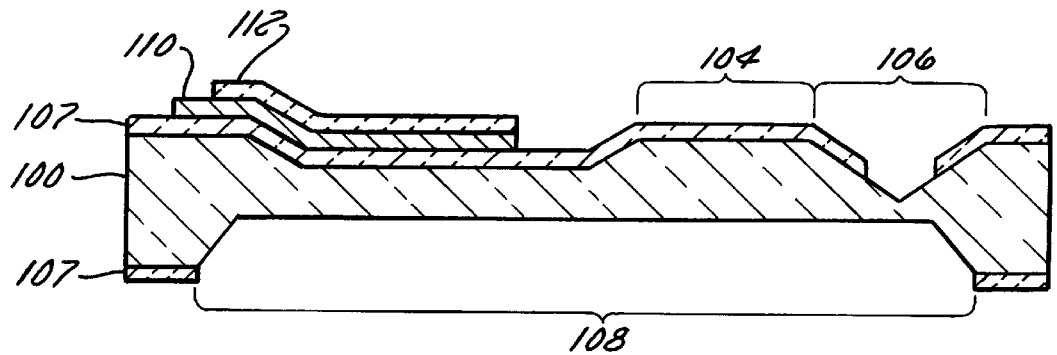
Figure 5F:
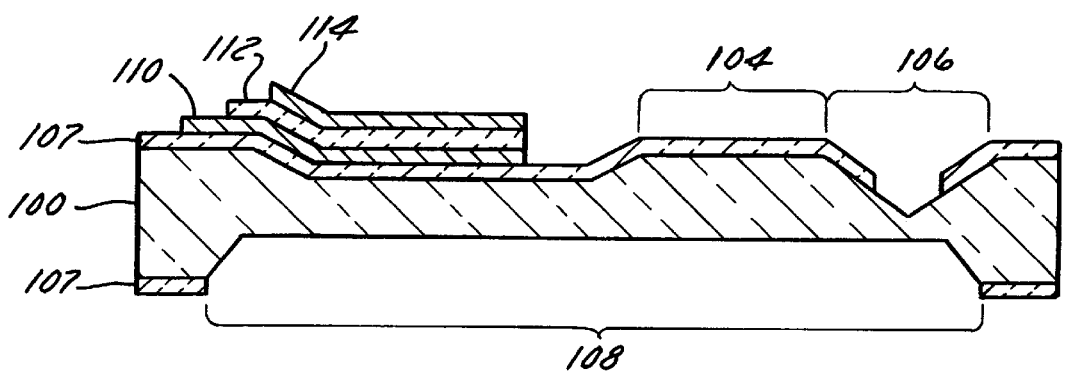

The fourth mask level defines a bottom electrode 110 on the top side of the substrate 100 which is electrically isolated from the substrate surface with $SiO_2$ layer 107; the electrode is defined by depositing a layer of titanium/gold (gold with a thin (~200 A) film of titanium to adhere the gold to the substrate) via evaporation and is shown in FIG. 5D. The fifth mask level forms the bimorph material layer 112 in FIG. 5E, which is deposited by sputtering a layer of a bimorph material such as zinc oxide on top of bottom electrode 110. As shown in FIG. 5F, the sixth mask level defines the top electrode 114, formed by the same method as the bottom electrode 110, with the evaporation done by rotation to get good step coverage over the bimorph material and bottom electrode layers. The patterning for both top and bottom electrodes is preferably done using an image-reversal liftoff process using 20 micron thick photoresist, as described in M. E. Motamedi, R. J. Anderson, R. de la Rosa, L. G. Hale, W. J. Gunning, R. L. Hall and M. Khoshnevisan, "Binary optics thin film microlens array", SPIE Vol. 1751, Miniature and Micro-Optics, pp. 22–32 (1992).

The top of the mesa structure 104 serves as the resonator's reflective surface. The sixth mask level and top electrode deposition can also be used to place a layer of titanium/gold atop the mesa structure 104, to increase its reflectivity. Other metals may alternatively be deposited atop the mesa structure, but require an additional masking and deposition step if different from the metal of top electrode 114.

Figure 5G:
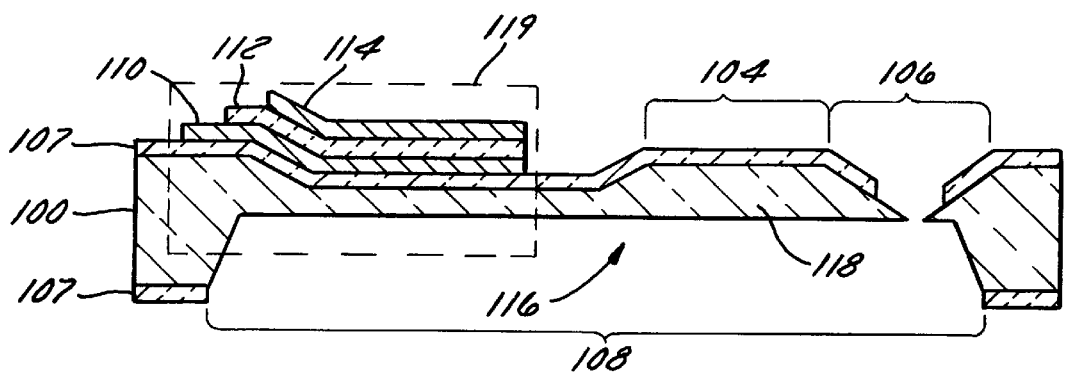

With the topside process steps complete, the silicon remaining between the bottom of the cut-through channel 106 and the backside 108 is etched away by reactive ion etching (RIE) using $X_2F_2$ (preferred because it is a highly selective etchant) or $SF_6$ gas etchant, forming a cantilever beam 116 having one end 118 which is free to bend (FIG. 5g). Stacked layers 107, 110, 112, 114, along with the portion of beam 116 below them, form a bimorph actuator 119.

There is typically some residual stress in the beam 116 as a result of the fabrication process, so that the beam rarely remains flat when its end 118 is freed. Instead, the beam usually bends upward. An upward bend upon freeing is preferred, as a downward bend may increase beam stress and thereby reduce its reliability.

The mesa structure 104 provides for a beam area that is thicker, and therefore stiffer, than the rest of the beam. This additional stiffness allows the attainment of an optical flatness for the reflective surface atop the mesa of at least $\lambda/4$ (assuming a $\lambda$ of about 0.6–0.7 micron, as produced by a typical laser diode). One functional optical resonator has been fabricated with beam dimensions of about 6.8 mm in length, about 3.4 mm in width, and about 10 micron in thickness—except in the mesa area, which is about 15 micron thick. The bimorph actuator covers slightly less than half of the beam area, with the rest of the beam area (at its free end), about 12 $mm^2$, dedicated for the reflective surface. For some applications, it may be necessary to add a layer of metal or a stack of dielectric layers in the reflective surface area to meet a particular optical efficiency specification.

A trade-off is necessary when specifying the parameters of reflective surface area and beam thickness. A large reflective surface area (and mesa structure) requires additional beam thickness, adding stiffness which reduces the possible scan angle; conversely, a thinner, more pliant beam has a smaller area which is sufficiently flat to serve as a reflective surface.

Figure 6A:
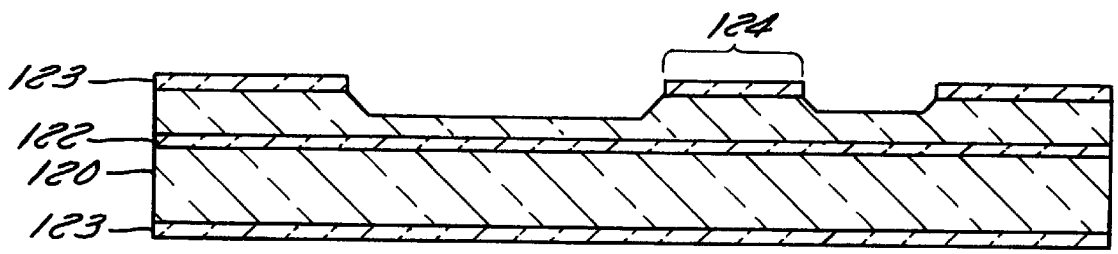
FIGS. 6A–6H are sectional views illustrating the preferred process sequence for fabricating an optical resonator that may be used in the optical code reader illustrated in FIG. 1.
Figure 6B:
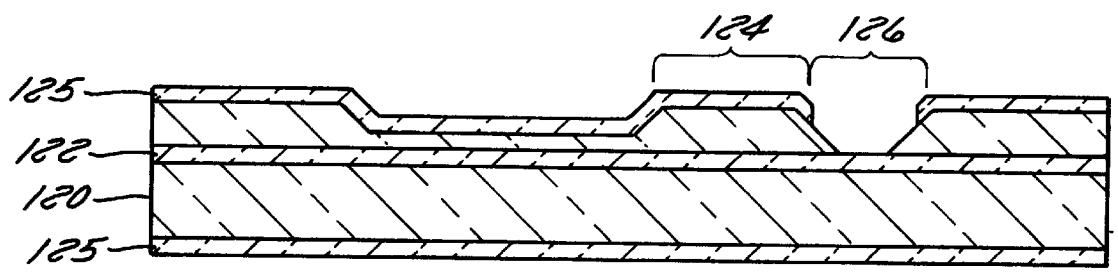
Figure 6C:
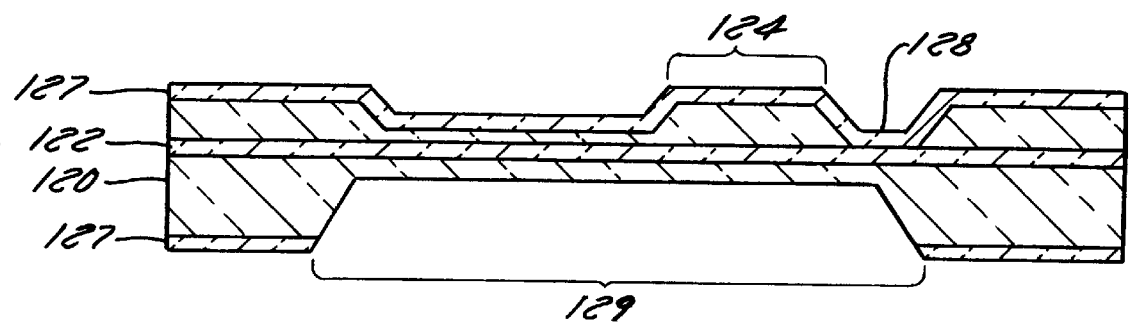
Figure 6D:
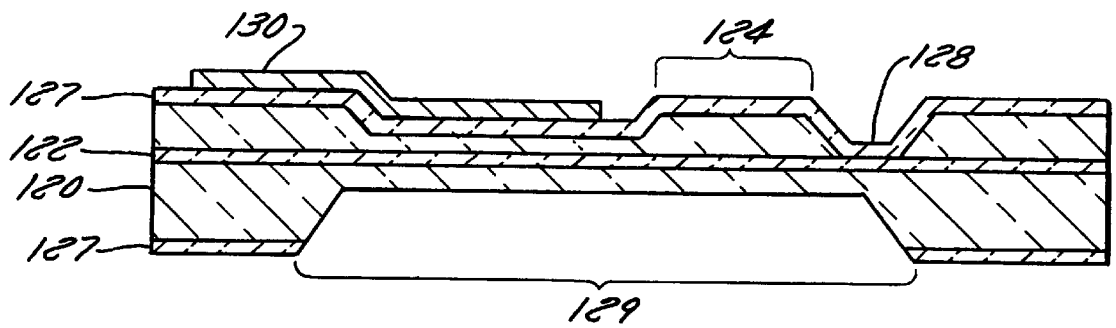
Figure 6E:
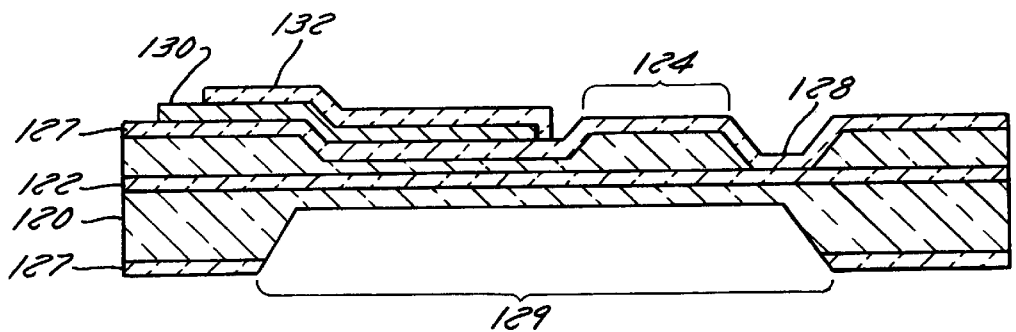
Figure 6F:
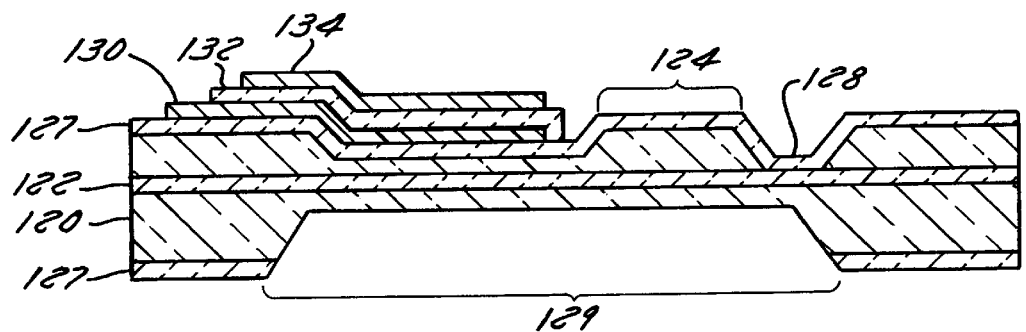
Figure 6G:
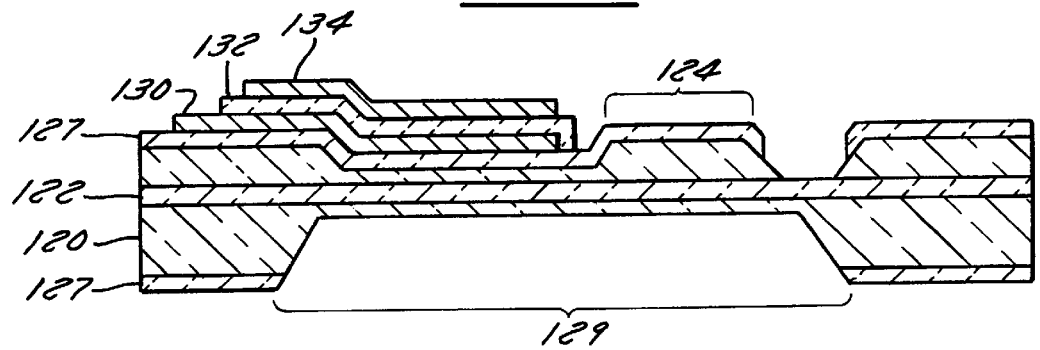

A preferred and novel fabrication process sequence is illustrated in the sectional views shown in FIGS. 6A–6H. As shown in FIG. 6A, a substrate 120 is procured which has an oxide layer 122 embedded within it at a specified depth, known as a "silicon-on-insulator" (SOI) wafer. Such a substrate is obtained by either implanting an oxide layer through the substrate, or by starting with two wafers, growing an oxide layer on one of the wafers and bonding it to the other wafer with the oxide in between, and then polishing the top wafer to a desired thickness. SOI wafers can be obtained from MEMC Electronic Materials Co. in St. Peters, Mo., for example. As with the process steps discussed above, an $SiO_2$ layer 123 is first grown on top and bottom of the substrate. A first mask establishes a mesa structure 124 (FIG. 6A) and a second mask defines a cut-through channel 126 (FIG. 6B), both etched using TMAH. Oxide layer 123 is stripped and a new oxide layer 125 is grown between the first and second mask steps. After the second mask step, oxide layer 125 is stripped and an new oxide layer 127 is grown, a portion 128 of which covers the bottom of the cut-through channel to protect it during subsequent processing steps. In FIG. 6C, the backside 129 is masked and etched with TMAH, removing most, but not all, of the silicon beneath the oxide layer. Masks 4, 5 and 6 in FIGS. 6D, 6E and 6F, respectively, define and deposit the bottom electrode 130, bimorph material layer 132 and top electrode 134, as before. The masking and deposition which define the top electrode can also be used to place a layer of titanium/gold atop the reflective surface 124, to increase its reflectivity. In FIG. 6G, the protective oxide layer 128 at the bottom of the cut-through channel has been removed in preparation for freeing the beam.

Figure 6H:
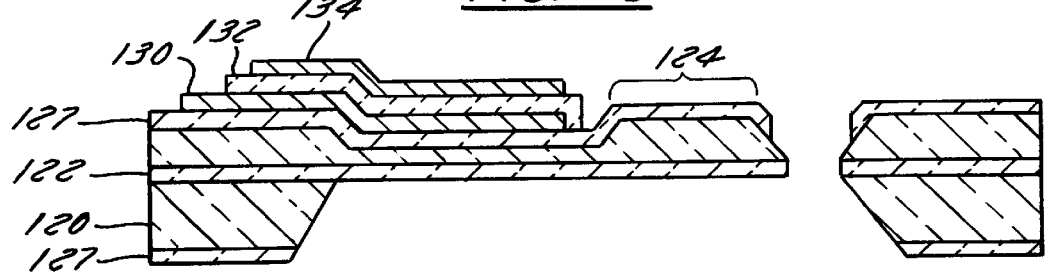

In FIG. 6H, the remaining thickness of silicon on the backside 129 is etched away by RIE using $X_2F_2$ (preferred because it is a highly selective etchant) or $SF_6$ gas etchant, which removes silicon precisely up to the embedded $SiO_2$ layer 122 and no further, freeing the end of the beam. In this way, the cantilever beam has a precisely known thickness, with the result that the parameters of stiffness, resonant frequency and useful reflective surface area are made much more predictable, and may be easily controlled by simply specifying the depth of embedded oxide layer 122.

Another significant advantage attributable to the use of an SOI wafer when fabricating a cantilever beam is an improved optical flatness. The symmetrical oxide layers on either side of the beam lower the beam's residual stress, so that less bending occurs when the beam is freed.

The fabrication of actuator excitation circuitry on the same substrate as the optical resonator of FIGS. 5 or 6 is preferably performed prior to the process steps needed to form the resonator. The circuitry should be passivated while the resonator's process steps are carried out, with the circuitry's contacts exposed upon completion of the resonator.

The actuator excitation circuitry may also be fabricated on a separate die and then interconnected to the resonator via wire bonds, for example. This hybrid approach has the advantage of simplifying the respective fabrication processes needed for the circuitry and the resonator, but has the drawback of introducing wire bonds which typically degrade circuit performance.

Figure 7A:
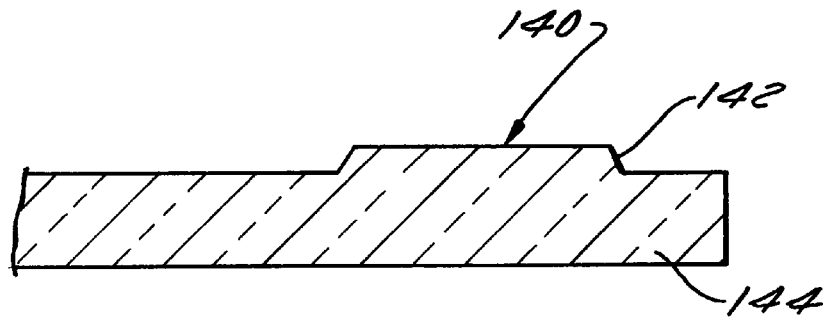
FIGS. 7A–7D are fragmentary sectional views illustrating a process sequence for fabricating a single-surface collimator on an optical resonator that may be used in the optical code reader illustrated in FIG. 1.
Figure 7B:
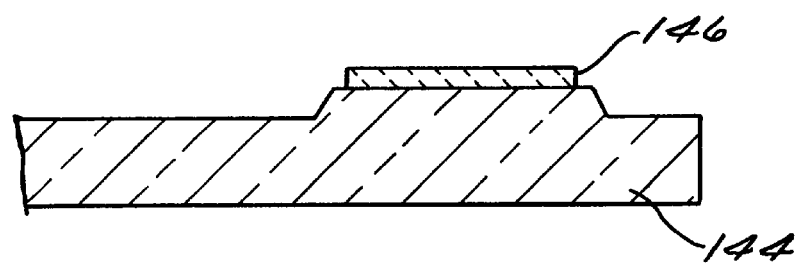
Figure 7C:
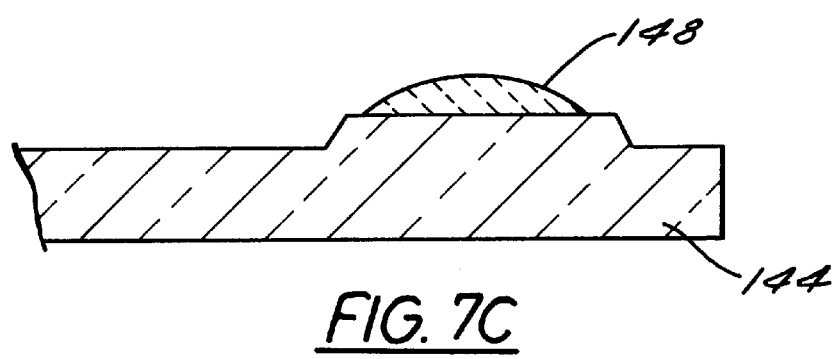
Figure 7D:
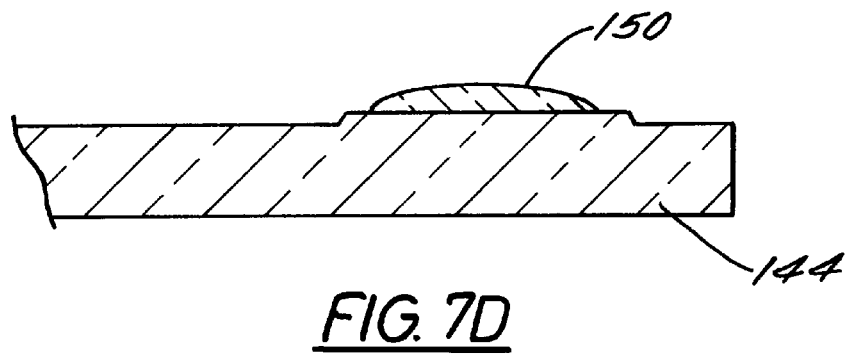

A process sequence may be performed, preferably after the first mask step of FIGS. 5 or 6 is performed, which places a single-surface collimator atop the mesa structure of the cantilever beam, providing a lensed reflective surface which reduces the need for collimating and focusing optics between a laser diode light source and the resonator. This sequence is illustrated in the fragmented sectional views of FIGS. 7A–7D. In FIG. 7A, a mesa structure 142 has been formed at the free end of cantilever beam 144. In FIG. 7B, a column of photoresist 146 is deposited on the mesa structure. The beam 144 is placed in a furnace and the photoresist melted, leaving a spherically-shaped mound of photoresist 148 atop the mesa 142. The mesa structure 142 and photoresist 148 are then RIE etched, removing the photoresist and some thickness of silicon at the top of the mesa, leaving a mound of silicon 150 atop the mesa. Because a spherical lens can cause aberrations, the RIE is specifically performed to insure that the remaining mound of silicon 150 is aspheric. When properly etched, the remaining silicon 150 functions as a single-surface collimator. Details of this process are described in M. E. Motamedi, H. O. Sankur, F. Durville, W. H. Southwell, R. Melendes, X. Wang, ' C. Liu, R. Rediker and M. Khoshnevisan, "Optical' Transformer and Collimator for Efficient Fiber Coupling", SPIE San Jose '97, Vol. 3008 (1997).

Figure 8:
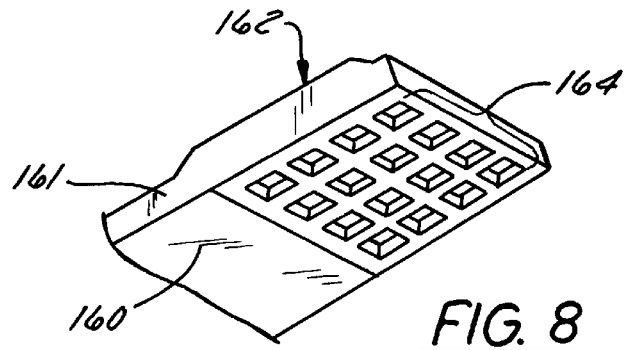
FIG. 8 is a perspective view of the underside of the free end of a cantilever beam, fabricated with depressions to increase the beam's stiffness.

Additional mechanical stiffness and thus optical flatness is obtainable in the area of the reflective surface by further increasing the thickness of the beam in the area of the mesa structure. In FIG. 8, a perspective view of the underside 160 of the free end of a cantilever beam 161 is shown. The thickness of the beam in the mesa structure and reflective surface area 162 is increased from that discussed before, i.e., from about 15 micron to about 20–25 micron, which adds stiffness in the mesa area as well as improving the optical flatness of the reflective area. However, the added thickness increases the weight and mass of the beam, which affects its resonant frequency values. To compensate, depressions 164, typically about 5–6 micron deep holes, are preferably made in the bottom surface of the beam opposite the mesa structure 162, to keep the beam's weight about the same as it was for the 15 micron thick mesa and to allow its resonant frequencies to be tuned.

Figure 9A:
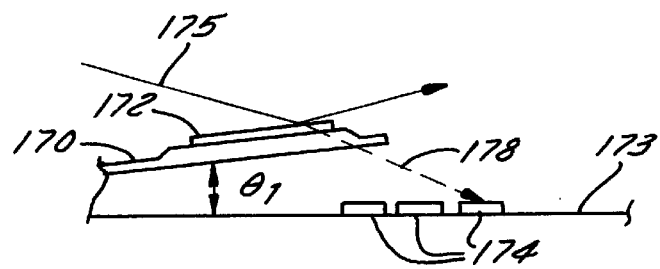
FIGS. 9A and 9B are sectional views illustrating the operation of a beam position detection scheme using a photodetector array.

Some scanning systems require that the position of the reflective surface be known as it oscillates. Two position detection schemes are shown in FIGS. 9 and 10. In FIG. 9A, a partial sectional view of a cantilever beam 170 and reflective surface 172 are shown, which is at a particular angle $\theta_1$ with respect to the surface 173 beneath the beam. A photodetector array 174 is also located on the surface 173. A light source directs light 175 onto the reflective surface 172, which reflects it to create a scanning line. The reflective surface 172 is made thin enough so that some of the incoming light 175 passes through the surface. The surface will deflect the light as it passes through, with the angle of deflection affected by the angle of the reflective surface with respect to the incoming light. The array 174 is positioned so that the deflected light 176 strikes at least one photodetector.

Figure 9B:
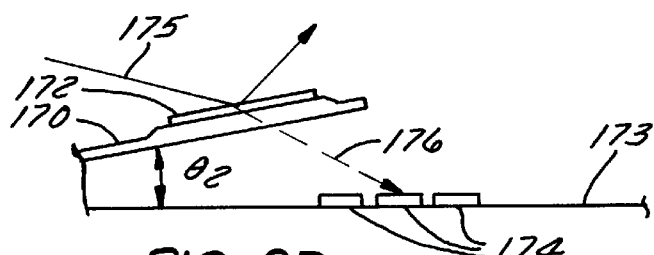
Figure 10:
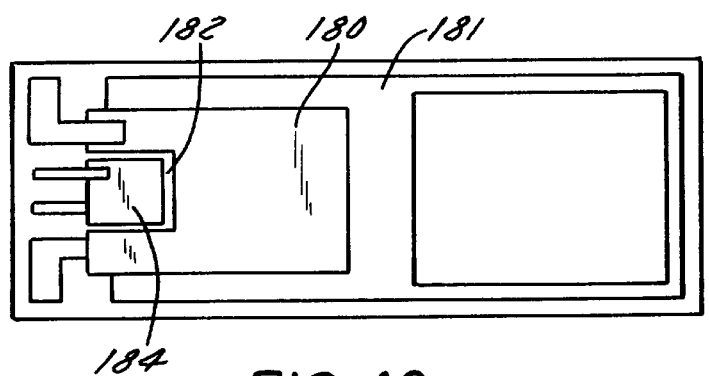
FIG. 10 is a plan view of a cantilever beam/actuator configuration illustrating the use of a stack of layers to generate a piezoelectric current for use with a beam position detection scheme.
Figure 11:
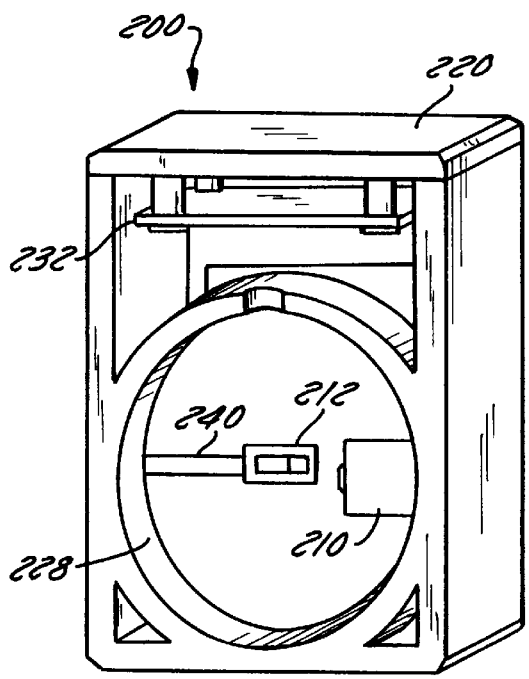
FIG. 11 is a perspective view of a second preferred embodiment of an optical code reader according to the present invention.
Figure 12:
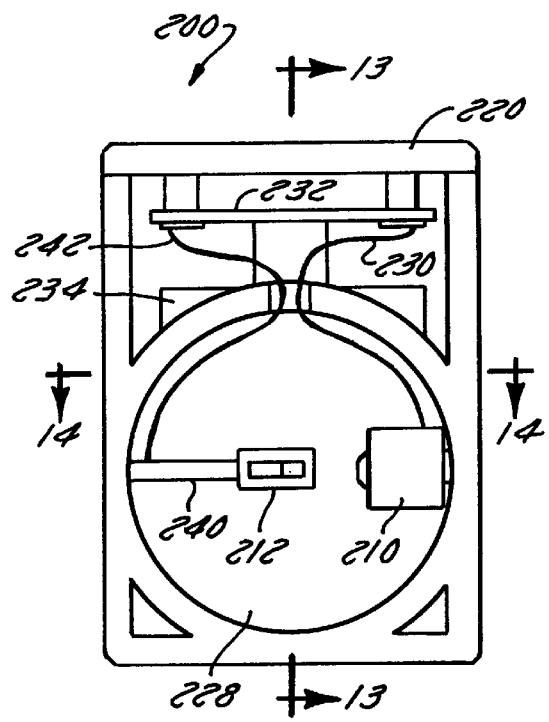
FIG. 12 is a front view of the optical code reader illustrated in FIG. 11.
Figure 13:
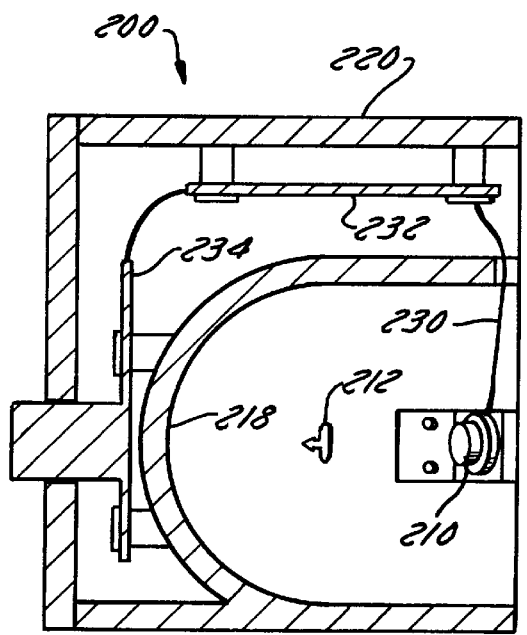
FIG. 13 is a view taken along the lines 13—13 in FIG. 12.
Figure 14:
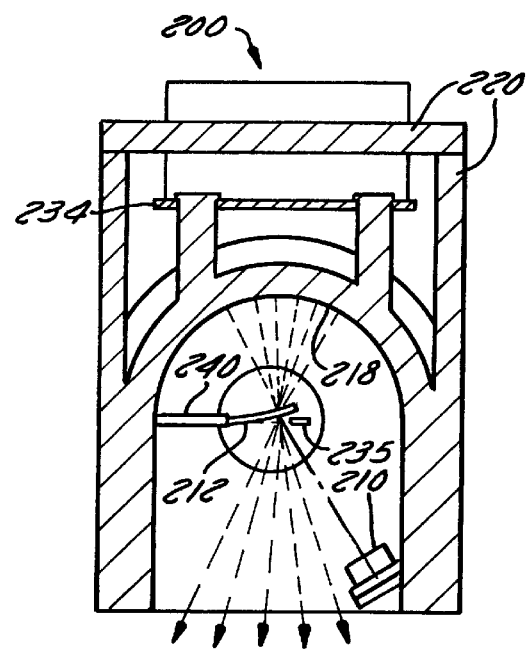
FIG. 14 is a view taken along the lines 14—14 in FIG. 12.
Figure 15:
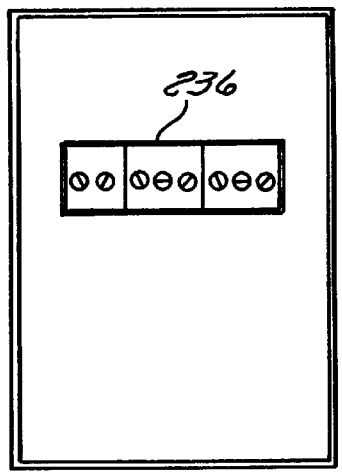
FIG. 15 is rear view of the optical code reader illustrated in FIG. 11.
Figure 16:
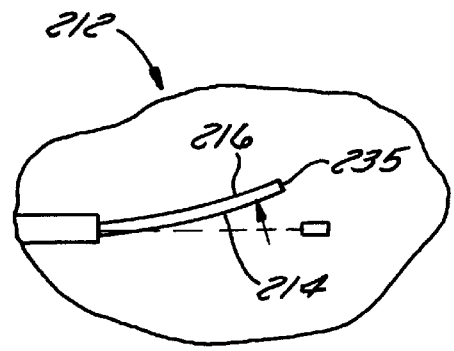
FIG. 16 is a detailed view of a cantilever beam of an optical resonator used in the optical code reader illustrated in FIG. 11.
Figure 17:
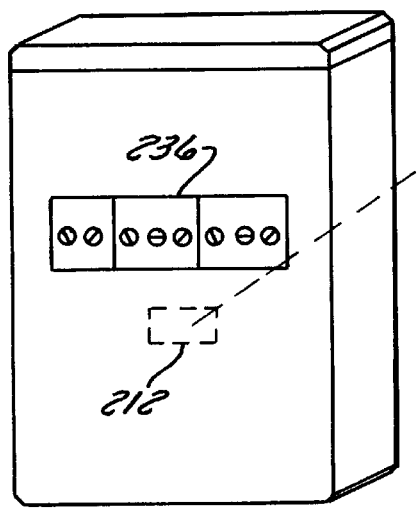
FIG. 17 is a perspective view of the optical code reader illustrated in FIG. 1 reading a bar code.
Figure 17:
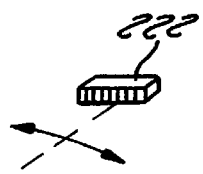

In FIG. 9B, the beam has moved to a second angle $\theta_2$ with respect to the surface 173. Incoming light 175 passes through reflective surface 172, and is deflected onto array 174, striking a different photodetector. By processing the signals produced by array 174, the position of the beam can be ascertained.

The technique discussed in connection with FIG. 9 is only useful when the incoming light 175 is at a wavelength which passes through the silicon cantilever beam, such as an infrared wavelength of about 1.2 micron. When the reflective surface 172 is coated with a metallic layer, the layer must be made thin enough so that some of the incoming light passes through it.

Another position detection scheme is shown in FIG. 10, which depicts a plan view of an optical resonator per the present invention. Bimorph actuator 180 comprises a stack of layers as before, including a substrate, oxide layer, bottom and top metal layers and a bimorph material layer, atop a cantilever beam 181. The actuator 180 is preferably fabricated with a cut-out area 182. A second stack of layers 184, physically separate from actuator 180 but preferably having the same composition of layers, so that it can be fabricated simultaneously with it, is located in the cut-out area 182. The stresses to which stack 184 is exposed due to the actuator-induced movement of the beam generates a piezoelectric current which varies with the beam's position. By processing the signal produced by stack 184, the position of the beam can be ascertained. It is not required that the stack 184 be located in the middle of the bimorph actuator 180. Positioning the stack 184 so that it is subjected to stresses similar to those experienced by the actuator, such as near the middle of the actuator or near one of its edges, will suffice.

2. Second Preferred Embodiment of Code Reader System and Method

Referring now to FIGS. 11–17, a code reader 200 in accordance with a second preferred embodiment of the invention is illustrated. By way of overview, the code reader 200 comprises a light source 210, an optical resonator 212 with both a transmit mirror 214 and a photodetector 216, and a collection mirror 218, which are all disposed within a housing 220.

More specifically, the code reader 200 comprises the light source 210 which is used to generate a light beam. The light beam produced by the light source 210 is reflected by the transmit mirror 214 while the transmit mirror 214 is oscillating to provide a moving spot of light on a code pattern located on a target 222.

The light source 210 is mounted on an inside front surface of the housing 220 along the periphery of a front aperture 228, and comprises one or more laser light sources having an output power of approximately 5 mW. Each laser light source includes a lens/aperture system that may be fixed or adjustable (either dynamically or offline) as with typical code reader systems. The light source 210 is connected by connection wires or circuit traces 230 to drive circuitry and other conventional circuitry disposed on circuit boards 232 and 234.

The code reader 200 also comprises the optical resonator 212 which is used to cause the transmit mirror 214 and the photodetector 216 to move or oscillate. The transmit mirror 214 and the photodetector 216 are disposed on opposite sides 254 and 248, respectively, of a free end of a cantilever beam 235. Therefore, when the cantilever beam 235 oscillates, the transmit mirror 214 and the photodetector oscillate as well. The cantilever beam 235 is caused to oscillate using a bimorph actuator in the manner previously described.

The optical resonator 212 is mounted within the housing 220 at approximately the center of an optical enclosure formed by the collection mirror 218 and the front surface of 5 the housing 220. The optical resonator 212 is fastened to a mounting structure 240 that extends from one side of the housing 220 to the center of the optical enclosure, although a mounting structure that attaches to the housing 220 at multiple locations may also be utilized. Connection wires or circuit traces 242 electrically connect the optical resonator 212 with circuitry located on the circuit boards 232 and 234. External connections (power, communication, and so on) are made to the circuit boards 232 and 234 by way of a terminal block 236 mounted on the back of the housing 220 (see FIG. 15).

The oscillating transmit mirror 214 reflects the light beam from the light source 210 to provide a moving spot of light. To this end, the optical resonator 212 is positioned such that the transmit mirror 214 is exposed and is pointed toward the front of the housing 220. The transmit mirror 214 is formed by depositing a gold or aluminum coating on the top surface of the cantilever beam 235. In general, however, a different reflective transmit surface could also be used, such as the silicon surface of the cantilever beam 235 without any gold or aluminum deposited thereon. Preferably, the transmit mirror 214 has an optical flatness of at least ¼ λ (assuming a λ of about 0.60–0.7 micron, as produced by a typical laser diode) to minimize distortion of the spot of moving light.

The photodetector 216 is used to detect the light beam reflected from the code pattern and to produce an electrical signal indicative thereof. As described below, the field of view of the photodetector 216 is dynamically altered by the movement of the cantilever beam such that the photodetector tracks the movement of the moving spot of light. In the code reader 200 of FIG. 11, this is achieved by the fact that both the transmit mirror 214 and the photodetector 216 are located on the cantilever beam 235 of the optical resonator 212.

The optical resonator 210 is generally the same as the optical resonator 11 described above, except that the cantilever beam 235 of the optical resonator 210 also has a photodetector disposed thereon. Since the fabrication of photodetectors in integrated circuits is well known, and since the remaining details regarding the fabrication of the optical resonator 210 have already been described in conjunction with the optical resonator 11, fabrication of the optical resonator 210 will not be described further to avoid obscuring the invention in detail.

Preferably, additional circuitry is included on the same substrate that forms the optical resonator 212. Conventionally, circuits that perform the following functions are found in code readers: laser drive, thermal sensing and interlock, power conditioning and distribution, interconnection and termination, safety shutdown, scan and raster drive, video signal processing, communication transceivers and controllers, ESD protection, EMC filtering, status indicators, transient protection, laser diode active cooling control, focus control, central processing, memory storage for program execution and configuration, processing for code timing and decoding, power for temporary parameter backup, shielding and grounding, I/O, and so on. Preferably, at least some of these functions are fabricated integral to the optical resonator 212 in lieu of being part of the printed circuit boards 232 and 234.

Feedback control circuitry could also be incorporated for controlling the extent of movement of the cantilever beam 235. In practice, however, it has been found that feedback control is usually not necessary, because the characteristics of the optical resonator 212 are quite stable over time and at varying temperatures.

The final major component of the preferred code reader 200 is the collection mirror 218. The collection mirror 218 receives the light beam reflected by the code pattern and redirects the light beam toward the photodetector 216, focusing the light beam on the photodetector 216 in the process. When the light beam is reflected from the code pattern, the light is scattered and much of the energy of the light beam is lost. The collection mirror (as well as the photodetector tracking described below) is therefore used to maximize the amount of laser light energy detected by the photodetector 216 and thereby to improve the signal-to-noise ratio of the output of the photodetector 216.

The collection mirror 218 is conical in shape and has a focal point located at the surface of the photodetector 216. The collection mirror 218 is provided with this shape in order to accommodate movement of the photodetector 216. Thus, as movement of the transmit mirror 214 causes laser light to be reflected back to different locations of the collection mirror 218, light remains focused on the photodetector 216. At each position of the photodetector 216 within the range of scanning motion, the focal point of the collection mirror 218 remains at the centroid of the surface of the photodetector 216. Thus, a mirror is utilized having a focal arc comprising a series of focal points, with the focal arc matching the range of possible positions of the photodetector 216. The precise dimensions of the mirror may be determined using optical design software such as the LightTools® modeling package from Optical Research Associates, 3280 E. Foothill Boulevard, Pasadena Calif.

Preferably, the collection mirror 218 is an integral part of the back wall that has been metallized for high reflectivity. Additionally, the photodetector 216 (or possibly the collection mirror 218) preferably has a coating that provides bandpass filtering in order to prevent light outside the range of the laser source wavelength from being added to the laser light reflected from the code pattern.

Notably, the fact that the collection mirror 218 is separate from the optical resonator 212 enhances the scalability of the code reader 200. In particular, if it is desired to change the read range of the code reader 200, a different collection mirror may be employed without having to utilize a different optical resonator. The flexibility of the code reader 200 is thereby enhanced.

The operation of the code reader 200 will now be described. First, the light source 210 generates a light beam 260 which is reflected by the transmit mirror 214 and is directed toward a code pattern disposed on a target 222. The light source 210 and the cantilever beam 235 (including the transmit mirror 214 and the photodetector 216) are positioned and aligned such that the laser beam is reflected from the transmit mirror 214 and out the front aperture 228 of the housing 220.

Simultaneously, movement of the transmit mirror 214 is driven in oscillatory fashion by the optical resonator 212. The optical resonator 212 is driven with a voltage stimulus that causes it to oscillate at its resonant frequency over a relatively large scan angle. Alternatively, if a 2-D code pattern is utilized, the optical resonator 212 may be driven with a voltage stimulus consisting of a higher frequency component superimposed on a lower frequency component to cause simultaneous torsion and bending oscillation (rastering and scanning), as previously described. As the optical resonator 212 oscillates, so too does the cantilever beam 235 and therefore the transmit mirror 214 (as well as the photodetector 216). The light beam reflected from the oscillating transmit mirror 214 produces a scan line or two dimensional pattern of lines, depending on the manner in which the optical resonator 212 is driven. (A "scan line" refers to the line traced by the light beam each time the reflective surface moves from one oscillation extreme to the other.) The scan line is directed at the code pattern on the target 222.

Next, the light beam is reflected by the code pattern and is directed back toward the collection mirror 218. As previously mentioned, much of the energy of the light beam is lost at the code pattern.

Next, the light beam is reflected by the collection mirror 218 and directed toward the photodetector 216. Due to the conical shape of the collection mirror 220, most of the light energy received at the collection mirror 218 is detected by the photodetector 216 and is converted into an electrical signal, although a small percentage may be obscured by the optical resonator 212 and its mounting structure 240. As previously mentioned, the shape of the collection mirror 218 accommodates movement of the photodetector 216, so that the photodetector remains at a focal point for a given light beam even as the photodetector 216 moves.

Finally, the light beam is focused on the photodetector 216 by the collection mirror 218 and detected by the photodetector 216. The electrical signal produced by the photodetector 216 is provided to circuitry that conditions the signal and decodes the encoded information. The decoded bar code data is then processed within the code reader 200 to cause certain action to occur and/or communicated by way of the terminal block 236 to other devices.

It should be noted that while one possible path has been described, other paths are also possible. In particular, one or more fold mirrors, beamsplitters or other elements may be used to amplify the optical scan and raster angles, improve device efficiency, and so on. Additionally, it would also be possible to place the photodetector 216 at another fixed location while still achieving the same benefits (especially, tracking). For example, the light beam reflected from the code pattern could be reflected from the cantilever beam a second time before being detected by a fixedly mounted photodetector, for example, by using a beam splitting arrangement.

The code reader 200 is able to achieve a scan rate in the range of hundreds of hertz. "Scan rate" refers to the number of times per second that a scan line is traced. Most existing optical resonators are only able to achieve a scan rate in the range of 50 Hz. The higher scan rate is highly advantageous because it permits more redundancy and also permits the code pattern to be read more quickly. This is especially important in conjunction with unattended systems, such as are used in factory and warehouse automation, in which the code reader is unattended and packages move past the code reader on a conveyor at high speeds.

The placement of the photodetector 216 on the cantilever beam 235 permits the photodetector 216 to track the movement of the moving spot of light produced by the light source 210 and the transmit mirror 214. This arrangement therefore provides code reader 200 with a very significant advantage over the code reader 10 described above. In particular, with the code reader 10, the field of view of the photodetector 36 remains unaltered as the beam 26 scans the target 38. Therefore, when the photodetector 36 detects light reflected from the target 38, the photodetector 36 also detects more background light (noise) not associated with the scanning of the target 38. Therefore, the signal provided by the photodetector 36 has a lower signal-to-noise ratio, thereby making it more difficult to distinguish light received from the target 38 from general background noise.

In the code reader 200, the field of view of the photodetector 216 is dynamically altered by the movement of the cantilever beam such that the photodetector 216 tracks the movement of the moving spot of light on the target 222 to insure that the intended return signal is received. The collection mirror 218 also enhances the performance of the code reader 200. The conical shape of the collection mirror 218 focuses light reflected from the code pattern on the photodetector 216 providing a significant optical gain due to a total surface area exceeding that of the photodetector 216. Also, the amount of background light detected by the photodetector 216 is reduced to only a cone defined by the aperture of the collection mirror 218. In this way, the signal level and the signal-to-noise ratio of the signal produced by the photodetector 216 are improved. As the signal-to-noise ratio increases, better performance as defined by long read range and large depths of field capability is achieved.

From the foregoing description, it should be apparent that the present invention provides a code reader that enjoys all the advantages that existing laser scanning based code readers already enjoy over image based systems, including high speed, high resolution, integral light source, longer range and larger depth of field. Moreover, from the foregoing description, it should be apparent that the present invention provides a code reader that also enjoys numerous additional advantages.

First, the code reader is structurally reliable. The code reader utilizes an optical resonator which is formed of a single crystal of silicon in microscale and which therefore has material properties that far exceed the bulk properties of non-single crystalline materials (e.g. poly silicon). Within the range of amplitudes of oscillation, the reliability of the structure is on the order of solid state device reliability.

Second, the code reader is low cost and small in size. Due to CMOS compatibility and batch processing, the optical resonator described herein is among the most compact and inexpensive scanning systems known to be able to achieve oscillation frequencies in the hundred of scans per second while also offering a scan angle over 20 degrees. Having circuitry for signal processing and driving the bimorph actuator integrated on the same substrate as the optical resonator allows calibration to be done to create a uniform population of scanners. Circuitry integrated with the optical resonator does not need to be implemented discretely on printed circuit boards, thus lowering the overall system cost and size significantly.

Third, the code reader is readily scalable. Different read ranges can be achieved by changing the collection mirror without having to change the optical resonator. The improved scalability is achieved through the separation of the light collection mirror from the optical resonator, and by the placement of the photodetector on the scanner.

Fourth, the code reader requires minimal power. The optical resonator operates on a driving voltage of less than 2V and a power input of less than 1 W.

Fifth, the code reader is constructed using a minimal number of discrete components. The optical resonator provides significant functionality on a monolithic structure that is normally constructed of several to many discrete components.

Finally, the code reader exhibits superior performance characteristics. Especially with respect to the second disclosed embodiment, the placement of the photodetector on the same cantilever beam as the reflective transmit surface permits a tracking system to be implemented. Additionally, the location of the photodetector at the focal point of a conical collection mirror maximizes the optical gain and the signal to noise ratio.

While particular embodiments of the invention have been shown and described, numerous variations and alternate embodiments will occur to those skilled in the art. Accordingly, it is intended that the invention be limited only in terms of the appended claims.

We claim:

1. An optical code reader comprising:
   (A) a housing; and
   (B) an integrated optical resonator, said optical resonator being disposed within said housing, said optical resonator including
      (1) a substrate,
      (2) a cantilever beam affixed at one end to said substrate, at least a portion of said cantilever beam having a reflective surface on one side and a photodetector on an opposite side, and
      (3) a bimorph actuator affixed to said cantilever beam and responsive to an electrical stimulus, and said bimorph actuator causing said cantilever beam to move in accordance with said stimulus.

2. An optical code reader according to claim 1, further comprising a light source, said light source generating a light beam, and
   wherein movement of said cantilever beam causes said reflective surface and said light beam to cooperate to provide a spot of light that moves on a code pattern, and
   wherein movement of said cantilever beam causes a field of view of said photodetector to be dynamically altered such that said photodetector tracks movement of said spot of light.

3. An optical code reader according to claim 1,
   wherein said reflective surface is a reflective transmit surface,
   wherein said code reader further comprises a reflective collection surface, said reflective collection surface having a conical shape, and
   wherein said photodetector is located approximately at a focal point of said reflective collection surface.

4. An optical code reader according to claim 3, further comprising a light source, said light source being disposed within said housing, said light source producing a light beam, said light beam being (1) reflected by said reflective transmit surface and directed toward a code pattern, and then (2) reflected by said code pattern and directed toward said reflective collection surface, and then (3) reflected by said reflective collection surface and directed toward said photodetector, and then (4) focused on said photodetector and detected by said photodetector.

5. An optical code reader according to claim 1, wherein said bimorph actuator comprises a plurality of stacked material layers on said cantilever beam, at least two of said plurality of stacked material layers having unequal thermal expansion coefficients.

6. An optical code reader according to claim 5,
   wherein said cantilever beam has a rest position, and
   wherein at least two of said plurality of stacked material layers comprise electrodes, said electrodes being arranged such that a current flowing between them causes said bimorph actuator to heat and said cantilever to move away from said rest position, and a reduction in current flowing between said electrodes causes said bimorph actuator to cool and said cantilever beam to move towards said rest position.

7. An optical code reader according to claim 1,
   wherein said integrated optical resonator further comprises actuator excitation circuitry, said actuator excitation circuitry being capable of providing stimulation to said bimorph actuator at about a resonant frequency of said bimorph actuator, and
   wherein said actuator excitation circuitry is integrated on said substrate.

8. An optical code reader according to claim 1,
   wherein said integrated optical resonator has first and second resonant frequencies,
   wherein an electrical stimulus provided to said integrated optical resonator at said first resonant frequency causes said integrated optical resonator to resonate in a first direction,
   wherein an electrical stimulus provided to said integrated optical resonator at said second resonant frequency causes said integrated optical resonator to resonate in a second direction,
   wherein said first and second directions are orthogonal, and
   wherein said optical code reader comprises excitation circuitry that is capable of stimulating said integrated optical resonator at both said first and second frequencies so that said integrated optical resonator is capable of reading two-dimensional code patterns.

9. A method of optically reading a code pattern comprising:
   (A) generating a light beam;
   (B) stimulating a bimorph actuator, the stimulation of said bimorph actuator causing a free end of a cantilever beam to oscillate, said bimorph actuator and said cantilever beam being integrally fabricated on a substrate to form an integrated optical resonator, and said free end of said cantilever beam having a reflective surface and a photodetector disposed thereon;
   (C) reflecting said light beam from said reflective surface, said reflecting step being performed while said cantilever beam is oscillating such that said light beam provides a moving spot of light on said code pattern, said light beam being reflected from said code pattern; and
   (D) receiving said light beam reflected from said code pattern at said photodetector disposed on said cantilever beam.

10. A method according to claim 9 wherein, during said stimulating step, the oscillation of said cantilever beam causes said photodetector to move, and wherein the movement of said photodetector causes a field of view of said photodetector to be dynamically altered such that said photodetector tracks the movement of said spot of light.

11. A method according to claim 9, wherein said reflective surface is a reflective transmit surface, and further comprising the step of reflecting said light beam from a reflective collection surface before receiving said light beam at said photodetector, said reflective collection surface reflecting step including focusing said light beam on said photodetector.

12. A method according to claim 9, wherein said stimulating step comprises applying an AC voltage across said bimorph actuator, said AC voltage causing different portions of said bimorph actuator to heat and cool and to thereby expand and contract by different amounts in accordance with different thermal expansion coefficients.

13. A method according to claim 9, wherein said integrated optical resonator has first and second resonant frequencies, wherein a stimulus provided to said integrated optical resonator at said first resonant frequency causes said integrated optical resonator to resonate in a first direction, wherein a stimulus provided to said integrated optical resonator at said second resonant frequency causes said integrated optical resonator to resonate in a second direction, wherein said first and second directions are orthogonal, wherein the method further comprises stimulating said integrated optical resonator at both said first and second frequencies to permit the reading of two-dimensional code patterns.

14. A method of optically reading a code pattern, the method comprising:

(A) producing a moving spot of light on said code pattern, including (1) generating a light beam using a light source, (2) stimulating a bimorph actuator, the stimulation of said bimorph actuator causing a free end of a cantilever beam to oscillate, said bimorph actuator and said cantilever beam being integrally fabricated on a substrate to form an integrated optical resonator, and (3) reflecting said light beam from a reflective surface disposed on said cantilever beam, said reflecting step being performed while said cantilever beam is oscillating to produce said moving spot of light on said code pattern, said light beam being reflected from said code pattern;

(B) tracking said moving spot of light with a photodetector, including dynamically altering a field of view of said photodetector in accordance with the movement of said moving spot of light; and (C) detecting said light beam reflected from said code pattern with said photodetector.

15. A method according to claim 14, wherein said dynamically altering step comprises causing said photodetector to move, said photodetector being located on said cantilever beam and being caused to move when said cantilever beam is caused to oscillate.

16. A method according to claim 14, wherein said stimulating step comprises applying an AC voltage across said bimorph actuator, said AC voltage causing different portions of said bimorph actuator to heat and cool and to thereby expand and contract by different amounts in accordance with different thermal expansion coefficients.

17. An optical code reader comprising:

(A) a housing;

(B) a light source, said light source being disposed within said housing, said light source producing a light beam;

(C) an integrated optical resonator, said optical resonator being disposed within said housing, said optical resonator including (1) a substrate, (2) a cantilever beam affixed at one end to said substrate, at least a portion of said cantilever beam having a reflective transmit surface on one side and a photodetector on an opposite side, and (3) a thermal bimorph actuator affixed to said cantilever beam and responsive to an electrical stimulus, said thermal bimorph actuator comprising a plurality of stacked material layers on said cantilever beam, at least two of said plurality of stacked material layers having unequal thermal expansion coefficients, at least two of said plurality of stacked material layers comprising electrodes, said electrodes being arranged such that a current flowing between them causes said thermal bimorph actuator to heat and said cantilever beam to move away from a rest position and a reduction in current flowing between said electrodes causes said bimorph actuator to cool and said cantilever beam to move towards said rest position, said thermal bimorph actuator causing said cantilever beam to move in accordance with said stimulus, the movement of said cantilever beam causing said reflective transmit surface and said light beam to cooperate to provide a spot of light that moves on a code pattern, and said movement of said cantilever beam causing a field of view of said photodetector to be dynamically altered such that said photodetector tracks the movement of said spot of light; and (D) a reflective collection surface, said collection surface having a conical shape, and said reflective collection surface having a focal point that is located at approximately the location of said photodetector; and wherein said light beam is (1) reflected by said reflective transmit surface and directed toward a code pattern, and then (2) reflected by said code pattern and directed toward said reflective collection surface, and then (3) reflected by said reflective collection surface and directed toward said photodetector, and then (4) focused on said photodetector and detected by said photodetector.

* * * * *